(12) United States Patent
Chen et al.

(10) Patent No.: US 9,570,133 B2
(45) Date of Patent: Feb. 14, 2017

(54) LOCAL WORD LINE DRIVER

(71) Applicants: Han-Sung Chen, Hsinchu (TW);
Chun-Hsiung Hung, Hsinchu (TW);
Chung-Kuang Chen, Hsinchu (TW)

(72) Inventors: Han-Sung Chen, Hsinchu (TW);
Chun-Hsiung Hung, Hsinchu (TW);
Chung-Kuang Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 626 days.

(21) Appl. No.: 13/713,883

(22) Filed: Dec. 13, 2012

(65) Prior Publication Data

US 2013/0100758 A1    Apr. 25, 2013

Related U.S. Application Data

(63) Continuation-in-part of application No. 12/785,297, filed on May 21, 2010, now Pat. No. 8,363,505.

(30) Foreign Application Priority Data

Dec. 17, 2009  (TW) .............................. 098143429 A

(51) Int. Cl.
*G11C 8/08* (2006.01)
(52) U.S. Cl.
CPC ...................... *G11C 8/08* (2013.01)
(58) Field of Classification Search
CPC ....................................................... G11C 8/08
See application file for complete search history.

(56) References Cited

U.S. PATENT DOCUMENTS

| | | | |
|---|---|---|---|
| 4,085,498 A | 4/1978 | Rideout | |
| 4,737,936 A | 4/1988 | Takeuchi | |
| 5,808,500 A * | 9/1998 | Kalpakjian | 327/321 |
| 6,025,751 A | 2/2000 | Chiang et al. | |
| 7,177,226 B2 | 2/2007 | Lee | |
| 8,072,834 B2 * | 12/2011 | Khamesra et al. | 365/230.06 |
| 2004/0141362 A1 * | 7/2004 | Sumitani et al. | 365/154 |
| 2007/0030738 A1 | 2/2007 | Oh | |
| 2007/0278554 A1 | 12/2007 | Song et al. | |
| 2008/0106947 A1 * | 5/2008 | Cho | G11C 16/08 365/185.23 |

(Continued)

FOREIGN PATENT DOCUMENTS

| | | |
|---|---|---|
| CN | 102216996 A | 10/2011 |
| TW | 200837762 A | 9/2008 |

*Primary Examiner* — Douglas King
(74) *Attorney, Agent, or Firm* — Haynes Beffel & Wolfeld LLP

(57) ABSTRACT

A memory circuit with a word line driver and control circuitry is disclosed. The word line driver receives a first voltage reference signal, a second voltage reference signal, and an input signal. The word line driver has an output coupled to a word line. The control circuitry is configured to deselect the word line by applying the input signal to the input of the word line driver. For example, in a program operation the word line is deselected to indicate that the word line is not programmed, and another word line is selected to be programmed. During an operation in which the word line is deselected and another word line is selected, the word line discharges through both of a first p-type transistor and a first n-type transistor of the word line driver.

21 Claims, 18 Drawing Sheets

| Read | select | deselect | deselect | deselect |
|---|---|---|---|---|
| GWL | HV | HV | 0 | 0 |
| PP | -V | HV | -V | HV |
| NVSS | 0 | 0 | 0 | 0 |
| WL | HV | 0 | 0 | 0 |

(56) References Cited

U.S. PATENT DOCUMENTS

2008/0144389 A1 6/2008 Chen et al.
2010/0142306 A1 6/2010 Nakamura et al.
2011/0205829 A1 8/2011 Iida

* cited by examiner

| Read | select | deselect | deselect | deselect |
|---|---|---|---|---|
| GWL | HV | HV | 0 | 0 |
| PP | -V | HV | -V | HV |
| NVSS | 0 | 0 | 0 | 0 |
| WL | HV | 0 | 0 | 0 |

Fig. 4

| Program | select | deselect | deselect | deselect |
|---|---|---|---|---|
| GWL | HV | HV | 0 | 0 |
| PP | +V | HV | +V | HV |
| NVSS | 0 | 0 | 0 | 0 |
| WL | HV | 0 | 0 | 0 |

Fig. 5

2T Driver (1 per Row)

|  | Read/PGM | | | ERS | |
|---|---|---|---|---|---|
|  | SEL | DE-SEL | DE-SEL | SEL | DE-SEL |
| NWD | AVXP | AVXP | AVXP | AVXP | AVXP |
| GWL | AVXP | 0V | AVXP | 0V | 0V |
| PP | -2V | -2V | AVXP | AVXP | AVXP |
| NVS | 0V | 0V | 0V | -V | 0V |
| WL | AVXP | 0V | 0V | -V | 0V |

Fig. 17

|  | Read/PGM | | | ERS | |
|---|---|---|---|---|---|
|  | SEL | DE-SEL | DE-SEL | SEL | DE-SEL |
| NWD | AVXP | AVXP | AVXP | AVXP | AVXP |
| GWL | AVXP | 0V | AVXP | 0V | 0V |
| PP | 0V | 0V | AVXP | AVXP | AVXP |
| NVS | 0V | 0V | 0V | -V | 0V |
| WL | AVXP | 0V | 0V | -V | 0V |

Fig. 18

|     | Read |         | PGM   |         | ERS   |         |
| --- | ---- | ------- | ----- | ------- | ----- | ------- |
|     | SEL  | DE-SEL  | SEL   | DE-SEL  | SEL   | DE-SEL  |
| NWD | AVXRD | AVXRD  | AVXHV | AVXHV   | AVXEV | AVXEV   |
| GWL | AVXRD | 0V     | AVXHV | AVXHV   | 0V    | AVXEV   |
| PP  | AVXNV | AVXNV  | AVXNV | AVXNV   | AVXEV | AVXEV   |
| NVS | 0V   | 0V      | 0V    | 0V      | NV    | 0V      |
| WL  | AVXRD | 0V     | AVXHV | 0V      | NV    | 0V      |

Fig. 19

LOCAL WORD LINE DRIVER

REFERENCE TO RELATED APPLICATION

This application is a continuation-in-part of U.S. application Ser. No. 12/785,297 (now U.S. Pat. No. 8,363,505), filed on 21 May 2010 entitled Local Word Line Driver, which application claims priority of Taiwan Patent Application No. 098143429, filed on 17 Dec. 2009, which applications are incorporated herein by reference.

BACKGROUND

Field of the Invention

The technology relates to memory integrated circuits, in particular the word line driver of a memory integrated circuit.

Description of Related Art

Memory integrated circuits access memory cells with word lines powered by word line drivers. With the continuing trend towards decreasing die size and more stringent power requirements, two transistor, or 2T, word line drivers are another alternative.

However, in known 2T word line drivers, the transistor gate dielectric undergoes great electric field stress. For example, the 2T word line driver design of US Patent Application Publication 2011/0149675 requires negative input bias, to turn on the p-type transistor of the 2T word line driver when discharging a word line through the p-type transistor of the 2T word line driver. Without the negative input bias on the 2T word line driver design, the p-type transistor of the 2T word line driver fails to remain on long enough to discharge the word line to ground.

SUMMARY

One aspect of the technology is a memory circuit. The memory circuit includes a word line driver and control circuitry.

The word line driver receives a first voltage reference signal, a second voltage reference signal, and an input signal. The word line driver has an output coupled to a word line. The control circuitry is configured to deselect the word line by applying the input signal to the input of the word line driver. For example, in a program operation the word line is deselected to indicate that the word line is not programmed, and another word line is selected to be programmed. As discussed below, by sharing the same voltage polarity, voltage stress on the transistors is reduced, such as the p-type transistor of the word line driver.

Another aspect of the technology is a method of operating memory, as follows.

A word line driver receives a first voltage reference signal, a second voltage reference signal, and an input signal. The word line driver has an output coupled to a word line. The word line is deselected by applying the input signal to the input of the word line driver. The input signal has one of at least a select value and a deselect value. The select value and the deselect value have a same voltage polarity during a program operation.

Yet another aspect of the technology is a memory circuit. The memory circuit includes a word line driver including a first p-type transistor and a first n-type transistor, and control circuitry. The first p-type transistor has a first current carrying terminal which receives a first voltage reference signal. The first n-type transistor has a second current carrying terminal which receives a second voltage reference signal. The first p-type transistor and the first n-type transistor are electrically coupled together as a first CMOS inverter. The first CMOS inverter has a first input receiving an input signal, and a first output coupled to a word line.

The word line driver is configured to receive multiple deselect signals, any of which is sufficient to deselect the corresponding word line. The control circuitry is configured to deselect the word line by applying the first voltage reference signal to the first current carrying terminal of the first p-type transistor, and also configured to deselect the word line by applying the input signal to the first input of the first CMOS inverter.

The first voltage reference signal has one of at least a first reference value and a second reference value. The first reference value is greater than the second reference value. The input signal has one of at least a select value and a deselect value. The select value and the deselect value have a same voltage polarity as the first reference value during a program operation.

Various embodiments of these aspects of the technology are discussed below.

In one embodiment of the technology, during the program operation in which the word line is deselected and another word line is selected, the control circuitry prevents discharge of the word line via only a p-type transistor of the word line driver. For transistors of comparable size, discharge through the p-type transistor is slower than discharge through the n-type transistor. Discharge of deselected word lines is faster by preventing discharge through only the p-type transistor.

In one embodiment of the technology, the input signal of the word line driver has one of at least a select value (indicating that the word line is to be programmed, for example) and a deselect value (indicating that the word line is not to be programmed, for example). The select value and the deselect value have a same voltage polarity during a program operation.

In one embodiment of the technology, the first voltage reference signal is received from a global word line. The global word line selects or deselects a plurality of word lines positioned in mutual proximity.

In one embodiment of the technology, the word line is deselected, responsive to the control circuitry applying the first voltage reference signal to the first current carrying terminal of a first p-type transistor of the word line driver.

In one embodiment of the technology, the word line is selected, responsive to the control circuitry applying the input signal having the select value turning on a first p-type transistor of the word line driver and a first n-type transistor of the word line driver. Excessive leakage is prevented when both p-type and n-type transistors are on, by controlling the input signal (shown as PP voltage on FIG. 1) to track the threshold voltage of the NMOS transistor then ensuring that the NMOS turn-on condition keeps the leakage under the high boundary of target SPEC.

In one embodiment of the technology, the word line is selected, responsive to the control circuitry applying the input signal having the select value, the select value less than the first voltage reference signal and greater than the second voltage reference signal. This is different from common inverter operation, where the input voltage is equal to either of the reference voltages received by the inverter.

In one embodiment of the technology, the word line is selected to have a program voltage less than the first voltage reference signal and greater than the second voltage reference signal. This results from the intermediate value of the input voltage of the inverter.

In one embodiment of the technology, the word line is charged to the program voltage, responsive to the word line driver receiving a first select value in a first select signal and a second select value in a second select signal. The word line is selected to perform the program operation on one or more memory cells coupled to at least the word line. If either or both of these select signals has a deselect value, then the word line is deselected. The word line is deselected to perform the program operation on one or more memory cells not coupled to the word line.

In one embodiment of the technology, consecutive operations changing a word line voltage of the word line are separated by sufficient time to discharge the word line.

In read operations, the word line is at stable voltage level. When both PMOS and NMOS are turned on, the word line voltage level is decided by both of the threshold voltages of the PMOS and NMOS transistors, which varies with the temperature and the manufacturing process. Accordingly, it can be difficult to define an accurate read word line voltage level. Also, in read operations the voltage magnitudes are lower such that the stress voltage is lower than during program operation, such that the problem from stressed dielectric. But we still can use it in the read or the erase operation if need.

Various embodiments of multiple aspects of the technology are disclosed herein.

BRIEF DESCRIPTION OF THE DRAWINGS

FIG. 4 is a table of example read bias arrangements for nodes of the 2T word line driver shown in FIG. 1.

FIG. 5 is a table of example program bias arrangements for nodes of the 2T word line driver shown in FIG. 1.

FIG. 17 is a table of an example bias arrangement for the five nodes of the 2T word line driver shown in FIG. 1.

FIG. 18 is a table of another example bias arrangement for the five nodes of the 2T word line driver shown in FIG. 2.

FIG. 19 is a table of yet anther example bias arrangement for the 2T word line driver, with a generalized negative voltage.

DETAILED DESCRIPTION

Figure 1:
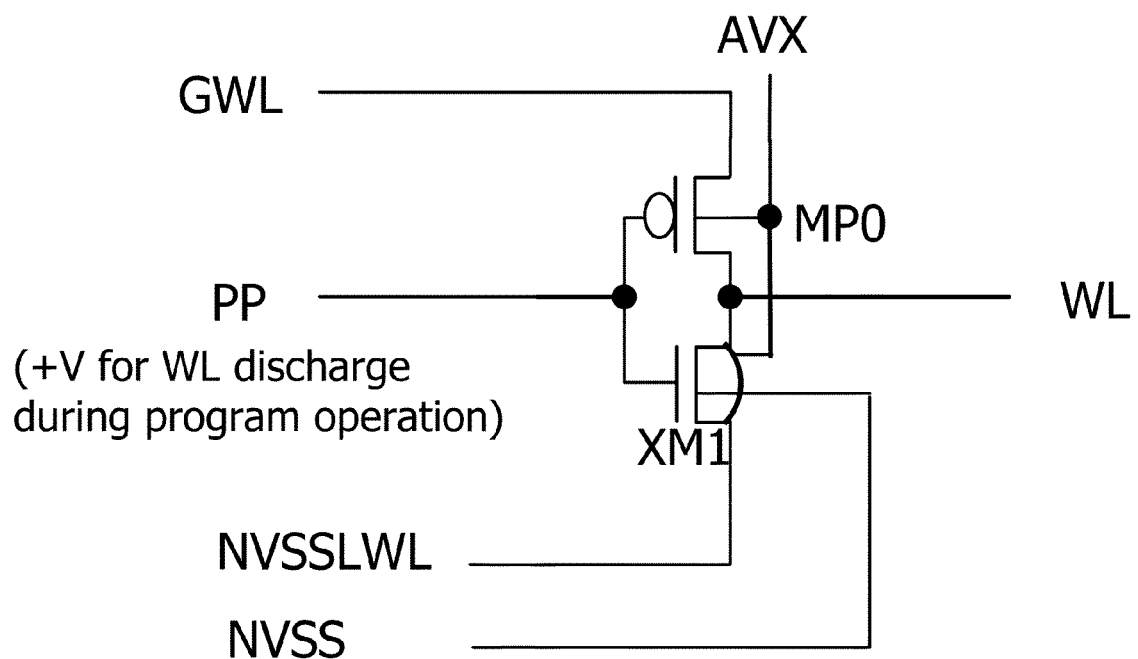
FIG. 1 shows a circuit diagram of a 2T word line driver as an example of the technology with an inverter including an n-type transistor and a p-type transistor, where during a program operation the input of the inverter receives a positive voltage to discharge a word line coupled to the output of the inverter.

FIG. 1 shows a circuit diagram of a 2T word line driver as an example of the technology with an inverter including an n-type transistor and a p-type transistor, where during a program operation the input of the inverter receives a positive voltage to discharge a word line coupled to the output of the inverter.

One 2T word line driver is coupled to one word line in the memory array. Transistor MP0 is a p-type transistor. Transistor XM1 is an n-type transistor. Both transistors have a source and a drain which are the current carrying terminals, and a gate. The gates of p-type transistor MP0 and n-type transistor XM1 are electrically connected to each other, and to signal PP which is one of two address signals selecting a particular word line controlled by a particular word line driver. The drains of p-type transistor MP0 and n-type transistor XM1 are electrically connected to each other, and to the word line WL driven by the word line driver. The source of p-type transistor MP0 is electrically connected to signal GWL, which is another one of two address signals selecting a particular word line controlled by a particular word line driver. The source of n-type transistor XM1 is electrically connected to signal NVSSLWL. Signal NVSS is electrically connected to the p-well of the n-type transistor XM1. The p-well of the n-type transistor XM1 is formed in an n-well, in which the p-type transistor MP0 is formed.

Figure 2:
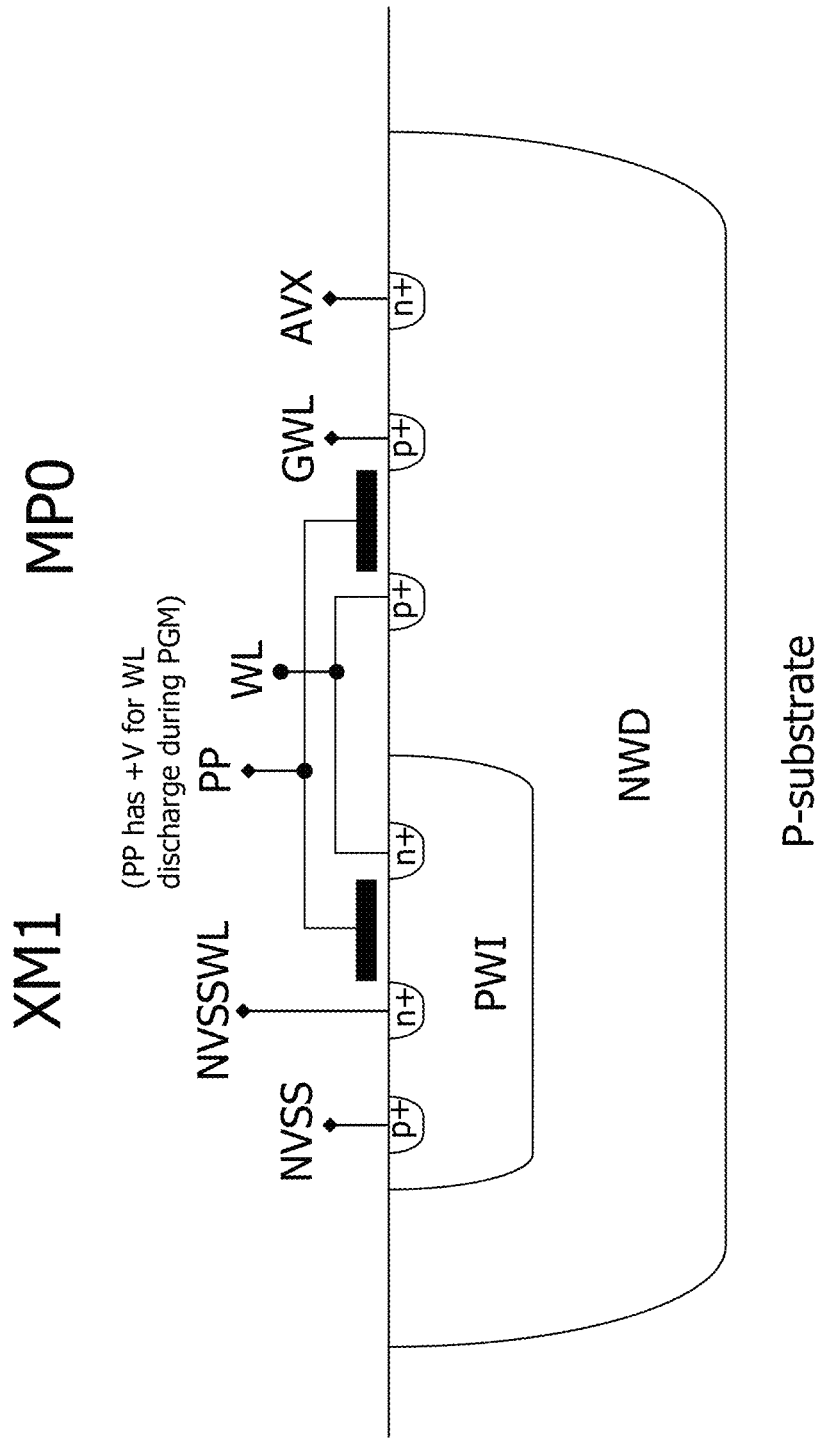
FIG. 2 is a depth cross-section of the 2T word line driver of FIG. 1, showing nodes of the 2T word line driver.

FIG. 2 is a depth cross-section of the 2T word line driver of FIG. 1, showing nodes of the 2T word line driver. The p-well implant PWI in the n-well diffusion NWD is shown. The n-well diffusion NWD is formed in the p-type substrate. The n-type transistor XM1 is formed in the p-well implant PWI. The p-type transistor MP0 is formed in the n-well diffusion NWD.

Figure 3:
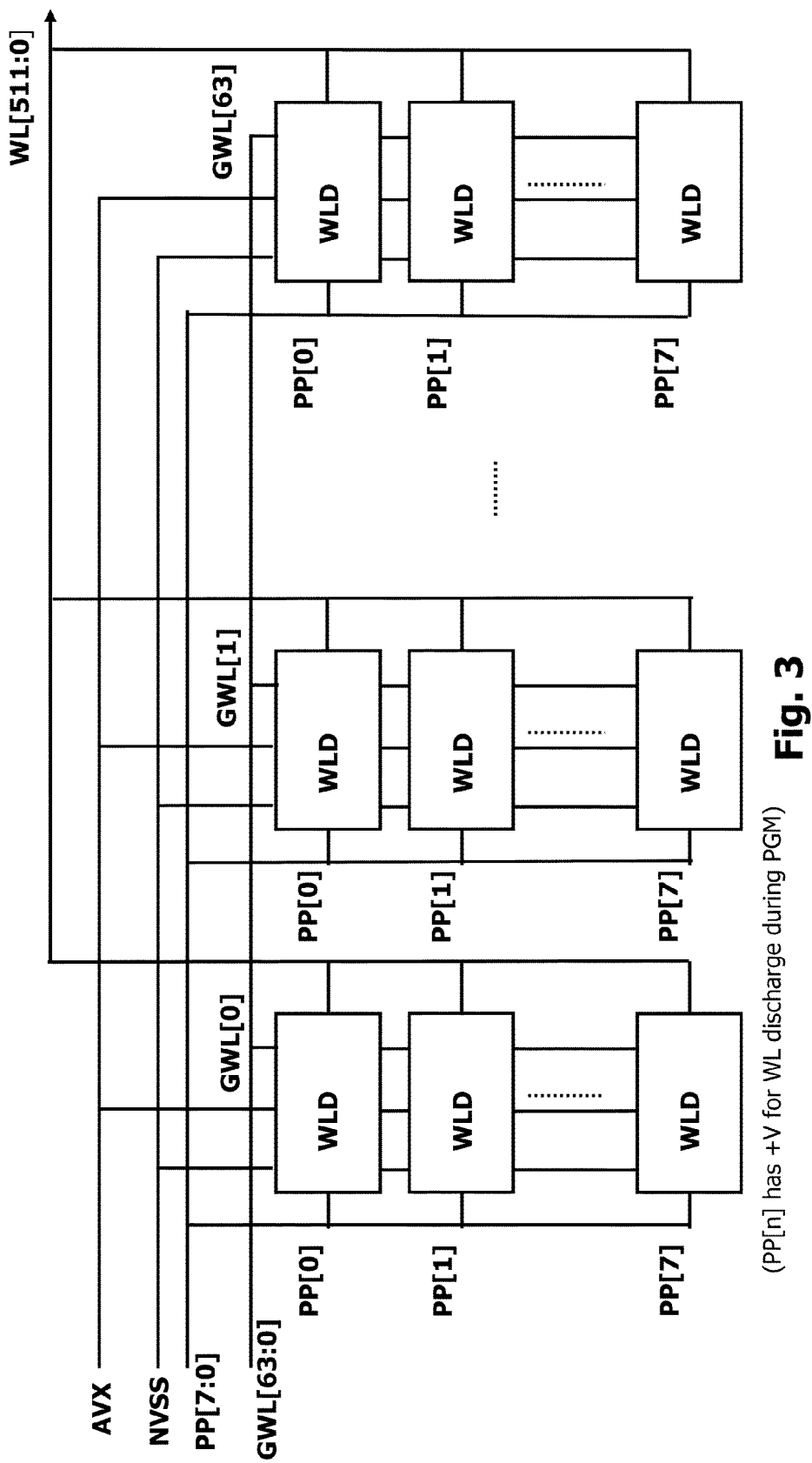
FIG. 3 is a simplified block diagram of an array of 2T word line drivers shown in FIG. 1, receiving the signals from multiple lines at nodes of the 2T word line drivers in the array, such that the signals select a particular 2T word line driver that drives a particular word line in the subsequent array of word lines.

FIG. 3 is a simplified block diagram of an array of 2T word line drivers shown in FIG. 1. Signals from multiple lines select a particular 2T word line driver that drives a particular word line in the subsequent array of word lines. The preceding array of global word line drivers select proximate groups of word line drivers via signals GWL[63:0]. As shown, each global word line signal (e.g., GWL[0], GWL[1], . . . GWL[63]) selects a group of 8 word line drivers. Within each such group of word line drivers, particular word line drivers are selected by signals PP[7:0].

Accordingly, a particular word line driver column shares the same GWL signal but has different PP signals within a column. A particular word line driver row shares the same PP signal but has different GWL signals within a row. The subsequent array of word lines (not shown) are controlled by the output signals of the array of 2T word line drivers, WL[511:0]. Other embodiments vary the number of signals and the number of elements controlled by the signals.

This example addressing arrangement selects a particular 2T word line driver from the array, and deselects other 2T word lines driver according to multiple separate address lines. Both signal PP and signal GWL select a particular word line corresponding to a particular word line driver.

FIG. 4 is a table of example read bias arrangements for nodes of the 2T word line driver shown in FIG. 1.

During a read operation, word lines are deselected by applying a reference signal such as 0V as the GWL signal. Also, word lines are deselected by applying a reference signal such as HV, a high positive voltage, as the PP signal. Word lines are selected by applying a reference signal such as HV, a high positive voltage, as the GWL signal; and by applying a negative voltage −V as the PP signal.

FIG. 5 is a table of example program bias arrangements for nodes of the 2T word line driver shown in FIG. 1.

During a program operation, word lines are deselected by applying a reference signal such as 0V as the GWL signal. Also, word lines are deselected by applying a reference signal such as HV, a high positive voltage, as the PP signal. Word lines are selected by applying a reference signal such as HV, a high positive voltage, as the GWL signal; and by applying a positive voltage +V as the PP signal.

One of the deselect voltage arrangements for a word line driver applies a reference signal such as 0V as the GWL signal, and a positive voltage +V as the PP signal. This voltage arrangement turns on both the n-type transistor to discharge the word line to NVSS (in this example, 0V), and the p-type transistor to discharge the word line to GWL (in this example, 0V).

In the deselect voltage arrangements for a word line driver that apply a reference signal such as HV, a high positive voltage, as the PP signal, the word line discharges through the n-type transistor.

Figure 6:
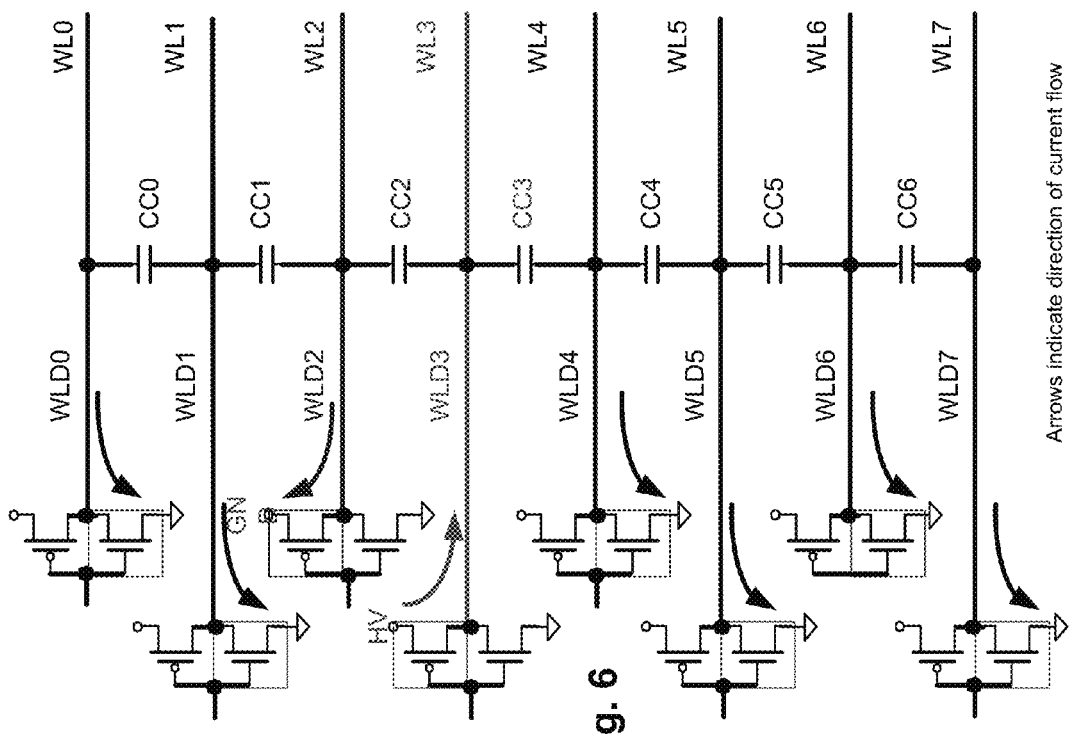
FIG. 6 is a simplified figure of an array of 2T word line drivers, showing a selected word line undergoing charging, and adjacent deselected word lines capacitively coupled to the selected word line that discharge primarily through the n-type transistor or p-type transistor of an inverter in the 2T word line driver.

FIG. 6 is a simplified figure of an array of 2T word line drivers, showing a selected word line undergoing charging, and adjacent deselected word lines capacitively coupled to the selected word line that discharge primarily through the n-type transistor or p-type transistor of an inverter in the 2T word line driver.

Word line drivers WLD0, . . . WLD7 control respective word lines WL0, . . . WL7. Adjacent word lines are capacitively coupled together, such that a voltage change on a particular word line results in a voltage change on an adjacent word line. Accordingly, when a particular word line is selected for an operation such as program, the adjacent word lines are deselected to counteract capacitively coupling from the selected word line.

Figure 7:
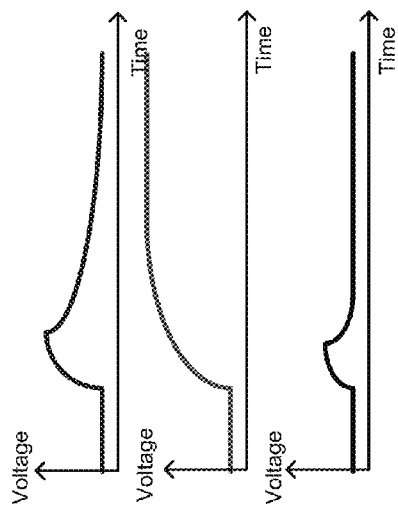
FIG. 7 is a simplified figure of an array of voltage vs. time graphs for 3 of the 2T word line drivers in FIG. 6, showing a selected word line undergoing charging to a program voltage, and adjacent deselected word lines capacitively coupled to the selected word line that discharge at different rates, depending on the discharging transistor.

FIG. 7 is a simplified figure of an array of voltage vs. time graphs for 3 of the 2T word line drivers in FIG. 6, showing a selected word line undergoing charging to a program voltage, and adjacent deselected word lines capacitively coupled to the selected word line that discharge at different rates, depending on the discharging transistor.

Word line WL3 is selected for an operation such as program. Accordingly, word line driver WLD3 charges word line WL3 to high voltage HV through the p-type transistor of word line driver WLD3. Due to capacitive coupling, the adjacent word lines WL2 and WL4 also increase in voltage. Word line WL4 is discharged through the n-type transistor of word line driver WLD4. Word line WL2 is discharged through the p-type transistor of word line driver WLD2. For a particular gate width, a p-type transistor is less efficient than an n-type transistor. Accordingly, word line WL2 being discharged through a p-type transistor has a longer transient than word line WL4 being discharged through an n-type transistor.

Figure 8:
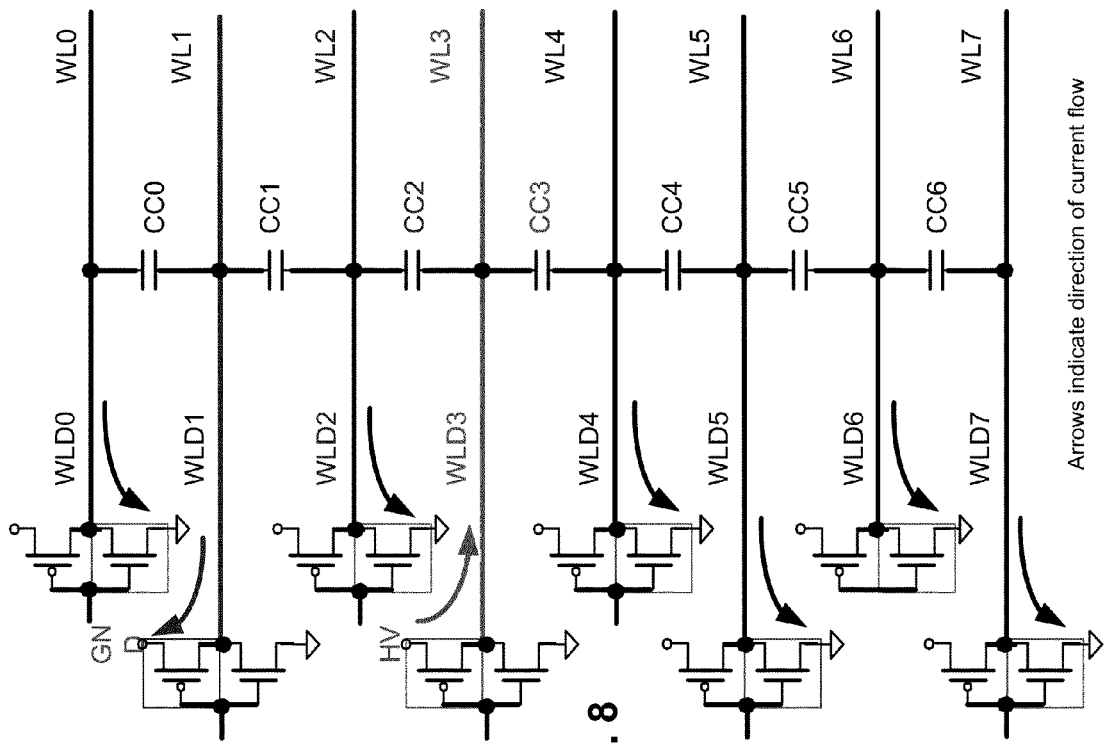
FIG. 8 is a simplified figure of an array of 2T word line drivers, showing a selected word line undergoing charging, and adjacent deselected word lines capacitively coupled to the selected word line that discharge primarily through the n-type transistor of an inverter in the 2T word line driver.

FIG. 8 is a simplified figure of an array of 2T word line drivers, showing a selected word line undergoing charging, and adjacent deselected word lines capacitively coupled to the selected word line that discharge primarily through the n-type transistor of an inverter in the 2T word line driver.

Figure 9:
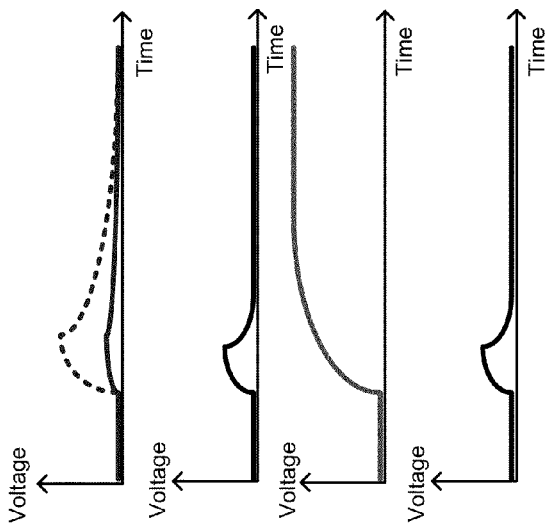
FIG. 9 is a simplified figure of an array of voltage vs. time graphs for 3 of the 2T word line drivers in FIG. 8, showing a selected word line undergoing charging to a program voltage, and adjacent deselected word lines capacitively coupled to the selected word line that discharge primarily through the n-type transistor of an inverter in the 2T word line driver.

FIG. 9 is a simplified figure of an array of voltage vs. time graphs for 3 of the 2T word line drivers in FIG. 8, showing a selected word line undergoing charging to a program voltage, and adjacent deselected word lines capacitively coupled to the selected word line that discharge primarily through the n-type transistor of an inverter in the 2T word line driver.

Similar to FIGS. 6-7, word line WL3 is selected for an operation such as program. However, in contrast with FIGS. 6-7, the adjacent word lines WL2 and WL4 both drain through respective n-type transistors. Accordingly, both the transient for word line WL2 and the transient for word line WL4 are relatively brief.

Figure 10:
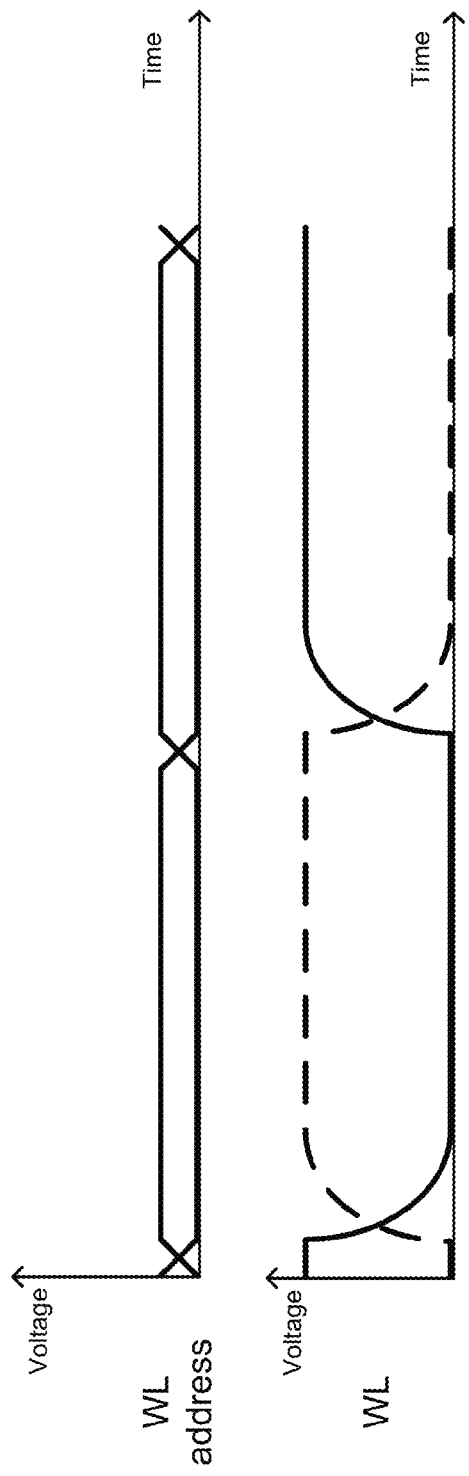
FIG. 10 is a graph of voltage versus time for a word line address signal and a word line voltage, without delay between consecutive communications of multiple word line addresses.

FIG. 10 is a graph of voltage versus time for a word line address signal and a word line voltage, without delay between consecutive communications of multiple word line addresses.

The graph of word line address voltage versus time shows that word line addresses are communicated consecutively, without intervening delay. The graph of word line voltage versus time shows that, before deselected word lines have sufficient time to discharge completely, the selected word line is charged for the operation such as program.

Figure 11:
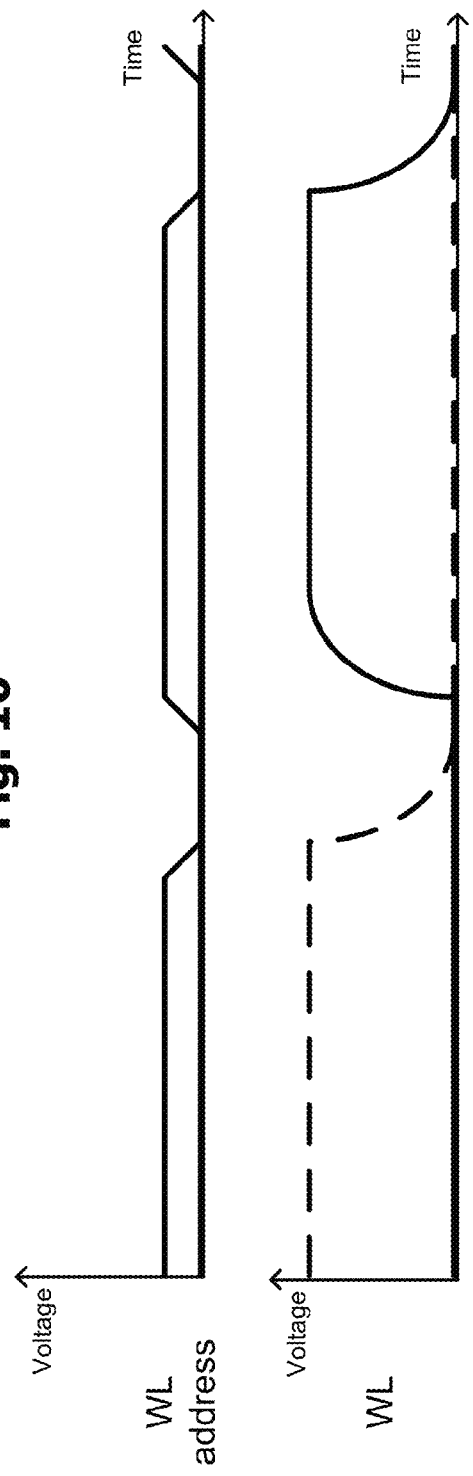
FIG. 11 is a graph of voltage versus time for a word line address signal and a word line voltage, with a delay between consecutive communications of multiple word line addresses.

FIG. 11 is a graph of voltage versus time for a word line address signal and a word line voltage, with a delay between consecutive communications of multiple word line addresses.

The graph of word line address voltage versus time shows that word line addresses are communicated, without an intervening delay between word line addresses. The graph of word line voltage versus time shows that, deselected word lines have sufficient time to discharge, before the selected word line is charged for the operation such as program. For example, the n-type transistor of a word line driver such as the n-type transistor XM1 of the word line driver in FIG. 1, can assist the p-type transistor, such as the p-type transistor MP0 of the word line driver in FIG. 1, with discharging a deselected word line.

Figure 12:
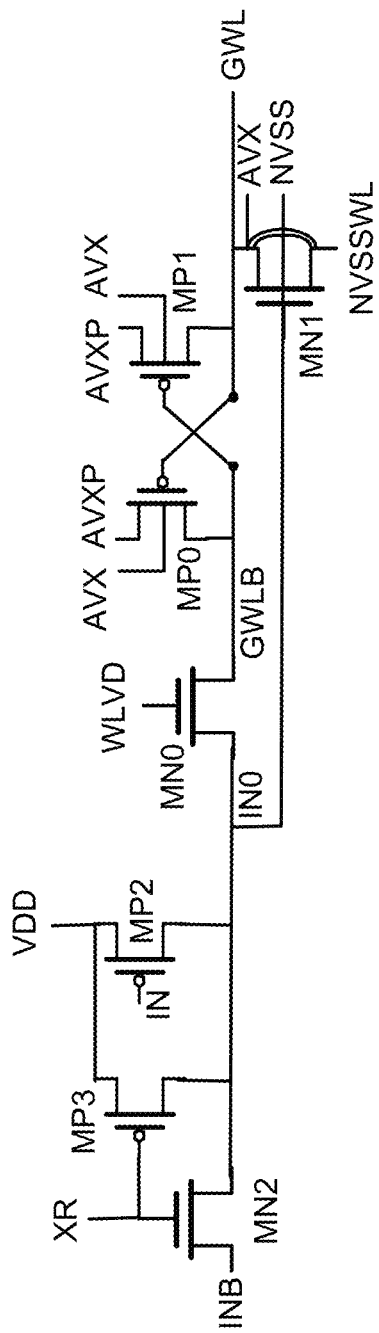
FIG. 12 is a simplified circuit diagram of a global word line driver.

FIG. 12 is a simplified circuit diagram of a global word line driver, such as one generating a GWL signal in FIG. 2 or 3.

N-type transistor MN2 has a gate coupled to signal XR, and current carrying terminals coupled to signals INB and node IN0.

P-type transistor MP3 has a gate coupled to signal XR, and current carrying terminals coupled to power VDD and node IN0.

P-type transistor MP3 has a gate coupled to signal IN (complement of IN), and current carrying terminals coupled to power VDD and node IN0.

N-type transistor MN0 has a gate coupled to signal WLVD, and current carrying terminals coupled to node IN0 and node GWLB.

P-type transistor MP0 has a gate coupled to node GWL, and current carrying terminals coupled to power AVXP and node GWLB.

P-type transistor MP1 has a gate coupled to node GWLB (complement of GWL), and current carrying terminals coupled to power AVXP and node GWL.

P-type transistors MP0 and MP1 have a body coupled to power AVX.

N-type transistor MN1 has a gate coupled to node IN0, and current carrying terminals coupled to node GWL power AVXP and power NVSSWL. N-type transistor MN1 also has a body coupled to NVSSWL and a well coupled to power AVX.

Figure 13:
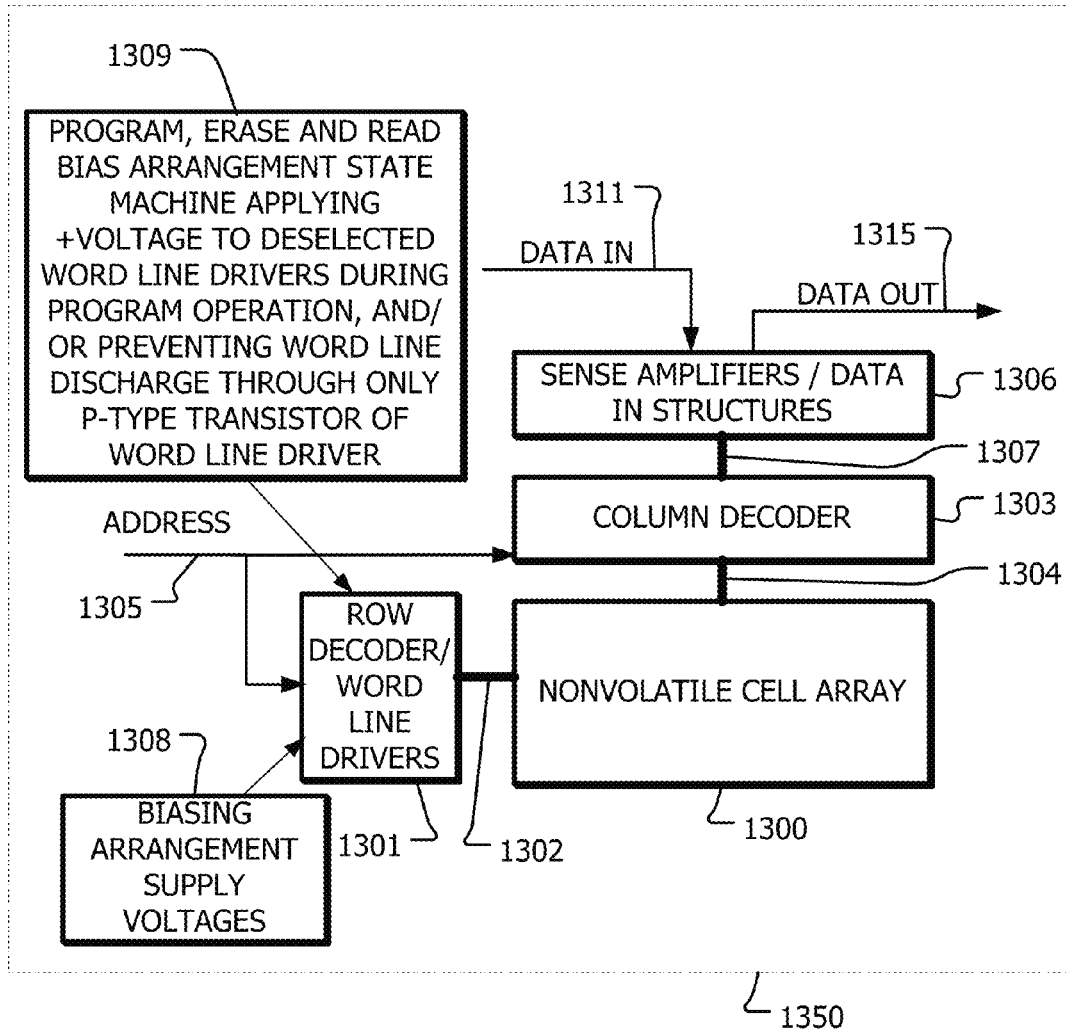
FIG. 13 is a simplified block diagram of an integrated circuit including a memory array implemented using any of the 2T word line driver improvements as described herein.

FIG. 13 is a simplified block diagram of an integrated circuit including a memory array implemented using any of the 2T word line driver improvements as described herein.

An integrated circuit 1350 including a memory array 1300. A word line (or row) and block select decoder 1301 is coupled to, and in electrical communication with, a plurality 1302 of word lines and string select lines, and arranged along rows in the memory array 1300. A bit line (column) decoder and drivers 1303 are coupled to and in electrical communication with a plurality of bit lines 1304 arranged along columns in the memory array 1300 for reading data from, and writing data to, the memory cells in the memory array 1300. Addresses are supplied on bus 1305 to the word line decoder and drivers 1301 and to the bit line decoder 1303. Sense amplifiers and data-in structures in block 1306, including current sources for the read, program and erase modes, are coupled to the bit line decoder 1303 via the bus 1307. Data is supplied via the data-in line 1311 from input/output ports on the integrated circuit 1350, to the data-in structures in block 1306. Data is supplied via the data-out line 1315 from the sense amplifiers in block 1306 to input/output ports on the integrated circuit 1350, or to other data destinations internal or external to the integrated circuit 1350. State machine circuitry 1309 controls biasing arrangement supply voltages 1308. State machine circuitry 1309 applies positive voltage to deselected word line drivers during an operation such as program. State machine circuitry 1309 also prevents discharge of a deselected word line through only the p-type transistor of a word line drive.

Figure 14:
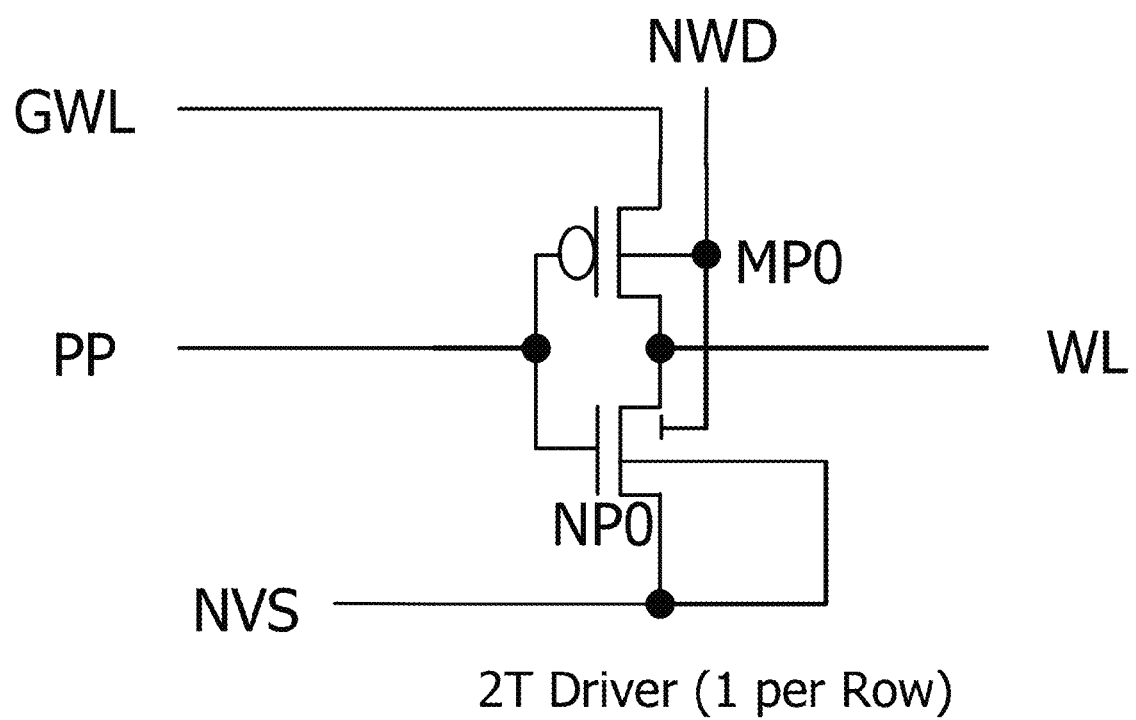
FIG. 14 shows a circuit diagram of a 2T word line driver as an example of the technology with an n-type transistor and a p-type transistor, where the p-type transistor to turns on with only negative gate voltage.

FIG. 14 shows a circuit diagram of a 2T word line driver as an example of the technology with an n-type transistor and a p-type transistor, where the p-type transistor to turns on with only negative gate voltage.

One 2T word line driver corresponds to one word line in the memory array.

Transistor MP0 is a p-type transistor. Transistor NP0 is an n-type transistor. Both transistors have a source and a drain which are the current carrying terminals, and a gate. The gates of p-type transistor MP0 and n-type transistor NP0 are electrically connected to each other, and to signal PP which is one of two address signals selecting a particular word line corresponding to a particular word line driver. The drains of p-type transistor MP0 and n-type transistor NP0 are electrically connected to each other, and to the word line WL driven by this word line driver. The source of p-type transistor MP0 is electrically connected to signal GWL, which is another one of two address signals selecting a particular word line corresponding to a particular word line driver. The source of n-type transistor NP0 is electrically connected to signal NVS; signal NVS is also electrically connected to the p-well of the n-type transistor NP0. The p-well of the n-type transistor NP0 is formed in an n-well, in which the p-type transistor MP0 is formed. This n-well is electrically connected to signal NWD.

Figure 15:
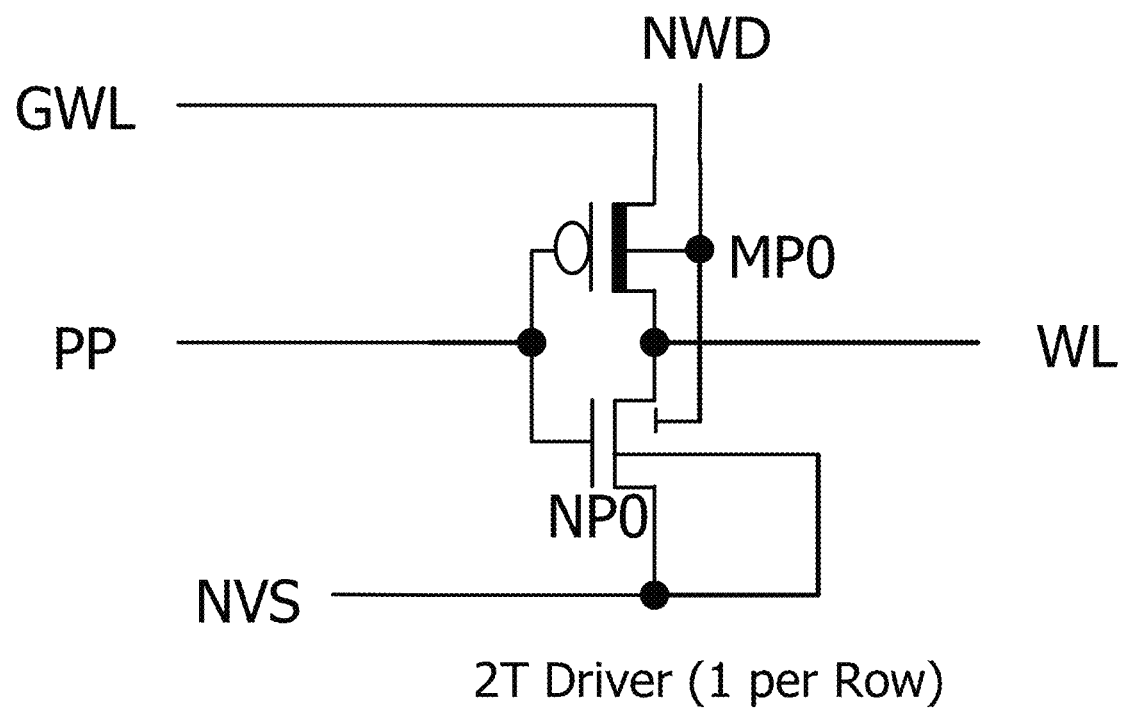
FIG. 15 shows a circuit diagram of a 2T word line driver as an example of the technology with an n-type transistor and a depletion mode p-type transistor, where the p-type transistor turns on with non-positive gate voltage.

FIG. 15 shows a circuit diagram of a 2T word line driver as an example of the technology with an n-type transistor and a p-type transistor, where the p-type transistor turns on with non-positive gate voltage. FIG. 15 is similar to FIG. 14. However, the symbol for the p-type transistor MP0 indicates a depletion mode device rather than an enhancement device. Accordingly, the depletion mode p-type transistor MP0 of FIG. 15 is on on 0V on the gate, whereas the enhancement mode p-type transistor MP0 of FIG. 14 is off at 0V on the gate. More particularly, the depletion mode p-type transistor MP0 of FIG. 15 is on at least at 0V and at negative voltages on the gate, and turns off with some positive voltage range on the gate, and some transition between 0V and this positive voltage range. The enhancement mode p-type transistor MP0 of FIG. 14 is off at 0V and at positive voltages on the gate, and turns on with some negative voltage range on the gate, and some transition between 0V and this negative voltage range.

Figure 16:
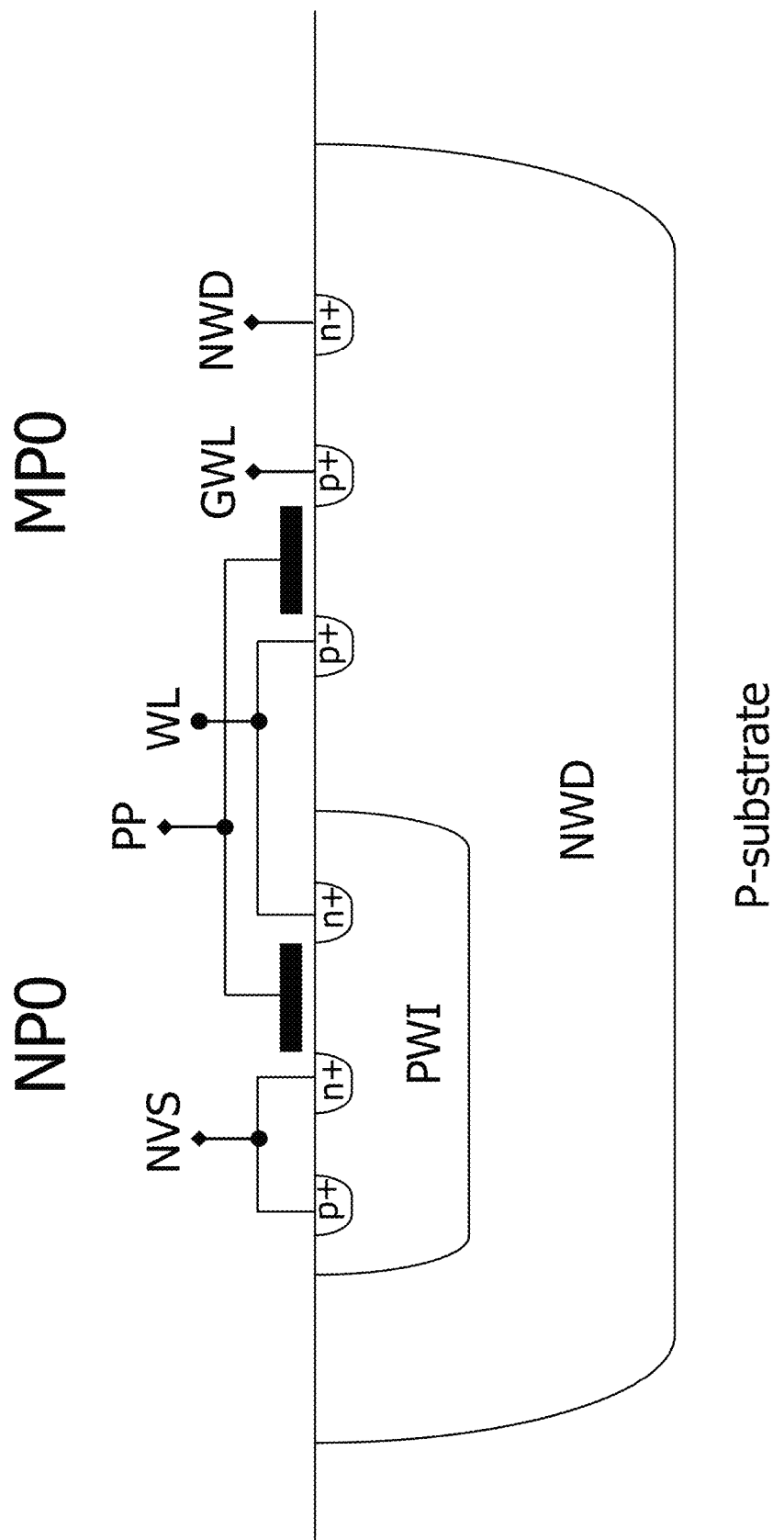
FIG. 16 is a depth cross-section of the 2T word line driver, showing the five voltage nodes of the 2T word line driver.

FIG. 16 is a depth cross-section of the 2T word line driver, showing the five voltage nodes of the 2T word line driver. The p-well implant PWI in the n-well diffusion NWD is shown. The n-well diffusion NWD is formed in the p-type substrate. The n-type transistor NP0 is formed in the p-well implant PWI. The p-type transistor MP0 is formed in the n-well diffusion NWD.

FIG. 17 is a table of an example bias arrangement for the five nodes of the 2T word line driver shown in FIG. 14. The bias arrangements are divided into read or program bias arrangements, and erase bias arrangements. The bias arrangements are further divided into word line select and word line de-select bias arrangements.

Both signal PP and signal GWL are address signals that select or deselect a particular word line corresponding to a particular word line driver. Both signal PP and signal GWL must select a particular word line corresponding to a particular word line driver. De-select occurs if either signal PP or GWL de-selects a particular word line corresponding to a particular word line driver. Accordingly, two de-select bias arrangements are shown among the read or program bias arrangements.

In the first de-select read or program bias arrangement, signal GWL de-selects. The negative PP signal turns off n-type transistor NP0 and turns on p-type transistor MP0. The p-type transistor MP0 electrically connects the signal GWL to the de-selected word line WL.

In the second de-select read or program bias arrangement, signal GWL de-selects. The positive AVXP signal turns on n-type transistor NP0 and turns off p-type transistor MP0. The n-type transistor NP0 electrically connects the signal NVS to the de-selected word line WL.

FIG. 18 is a table of another example bias arrangement for the five nodes of the 2T word line driver shown in FIG. 15. This table is similar to the table of FIG. 17. However, among the read or program bias arrangements, for both the select bias arrangement and the first de-select read or program bias arrangement, the signal PP is 0 V instead of –2 V. The table of FIG. 18 corresponds to the 2T word line driver of FIG. 15, with a depletion mode p-type transistor MP0, rather than an enhance mode p-type device. Accordingly, 0V for the signal PP is sufficient to turn on p-type transistor MP0. This contrasts with the table of FIG. 17 which corresponds to the 2T word line driver of FIG. 14, with an enhance mode p-type transistor MP0, and requires a negative voltage such as –2V to turn on p-type transistor MP0.

FIG. 19 is a table of yet anther example bias arrangement for the 2T word line driver, with a generalized negative voltage.

The signal and node abbreviations and associated voltage ranges are explained as follows:
AVXRD: WL voltage level for read
AVXHV: WL voltage level for program
AVXEV: WL voltage level for erase-verify
AVXNV: –1~3V from standby negative pump
NV: –8~–11V for erase
AVXP: WL power source
GWL: Global WL power node
PP: PMOS pass gate signal
NVS: negative voltage source FIG. 20 is a simplified block diagram of an array of 2T word line drivers, receiving the signals from multiple lines at the five nodes of the 2T word line drivers in the array, such that the signals select a particular 2T word line driver that drives a particular word line in the subsequent array of word lines.

Figure 20:
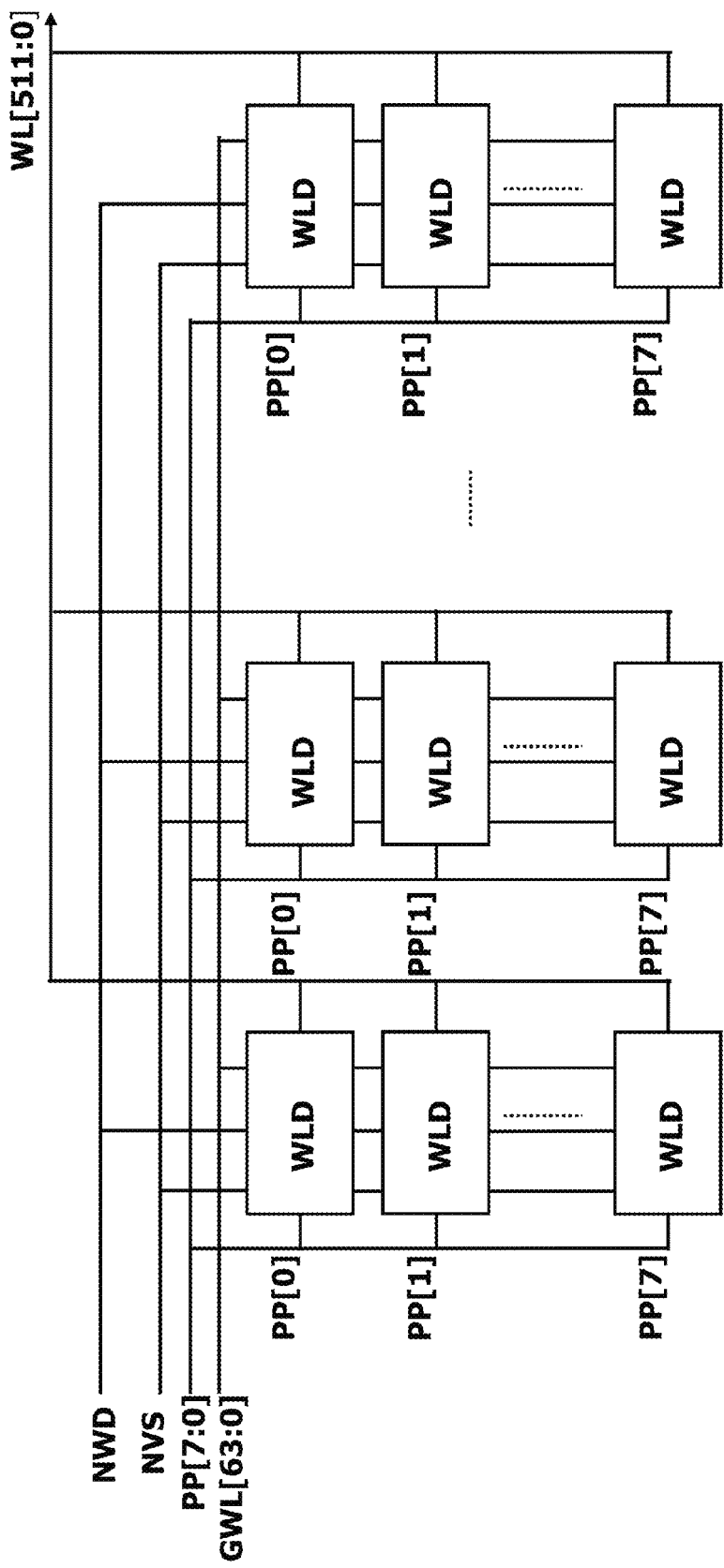
FIG. 20 is a simplified block diagram of an array of 2T word line drivers, receiving the signals from multiple lines at the five nodes of the 2T word line drivers in the array, such that the signals select a particular 2T word line driver that drives a particular word line in the subsequent array of word lines.

The 2T word line driver array is illustrated in FIG. 20 with 64 WLD columns, sharing the same GWL signal but having different PP signals within a column; and with 8 WLD rows sharing the same PP signal but having different GWL signals within a row.

Figure 21:
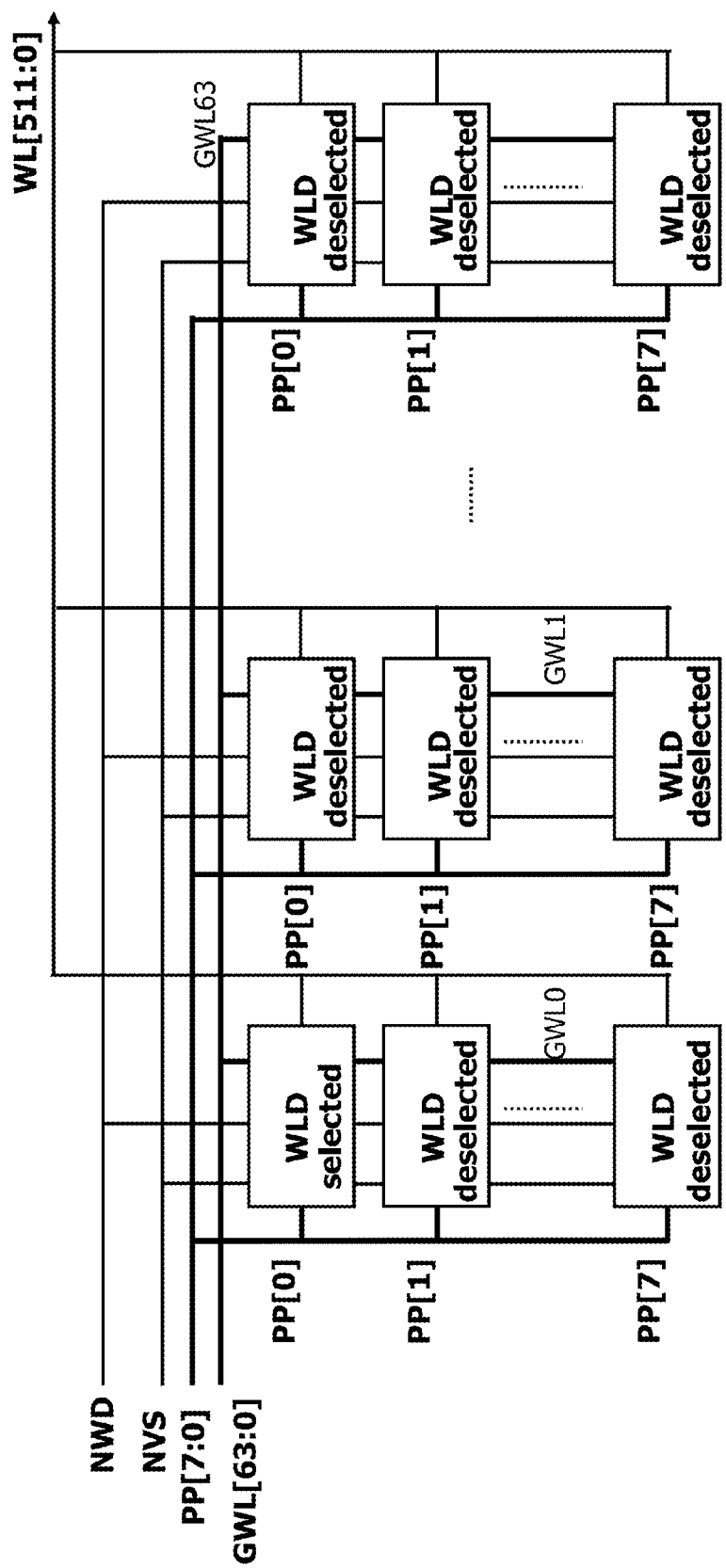
FIG. 21 is the simplified block diagram of an array of 2T word lines drivers of FIG. 7, showing an example addressing arrangement that selects a particular 2T word lines driver from the array, and deselects other 2T word lines driver according to two separate address lines.

FIG. 21 is the simplified block diagram of an array of 2T word lines drivers of FIG. 20, showing an example addressing arrangement that selects a particular 2T word lines driver from the array, and deselects other 2T word lines driver according to two separate address lines.

Both signal PP and signal GWL must select a particular word line corresponding to a particular word line driver. The 2T word line driver array is illustrated in FIG. 20 has signal PP[0] and GWL0 selecting the upper left word line driver, along with the word line corresponding to this word line driver. All other word line drivers (and their corresponding word lines) are deselected.

Figure 22:
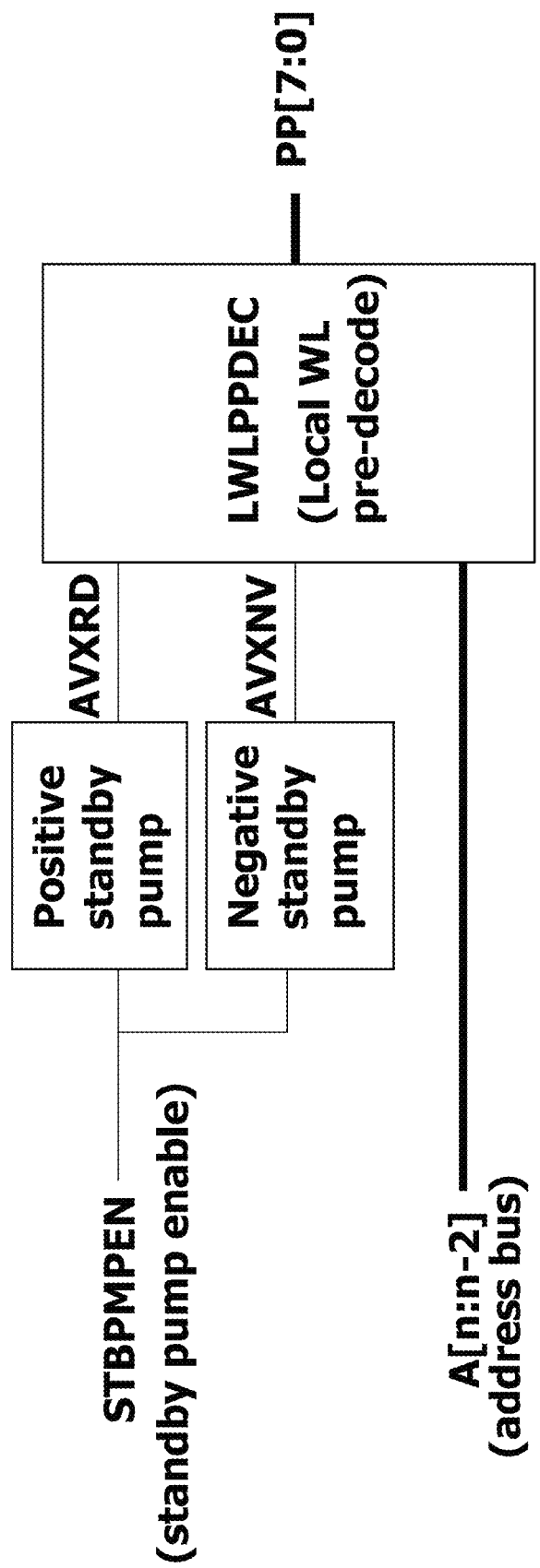
FIG. 22 is the simplified block diagram showing the positive and negative standby pumps that drive the array of 2T word lines drivers.

FIG. 22 is the simplified block diagram showing the positive and negative standby pumps that drive the array of 2T word lines drivers.

Signal STBPMPEN enables or disables the standby pumps. A positive standby pump generates signal AVXRD. A negative standby pump generates signal AVXNV. The negative standby pump is included if read mode does not have sufficient latency for generating negative voltage, and turns on p-type transistor MP0 with a negative voltage. In other words, the negative standby pump is not necessary if the p-type transistor MP0 is depletion mode. An address signal on an address bus is decoded by LWLPPDEC, which performs pre-decoding for local word lines and generates signals PP[7:0].

Figure 23:
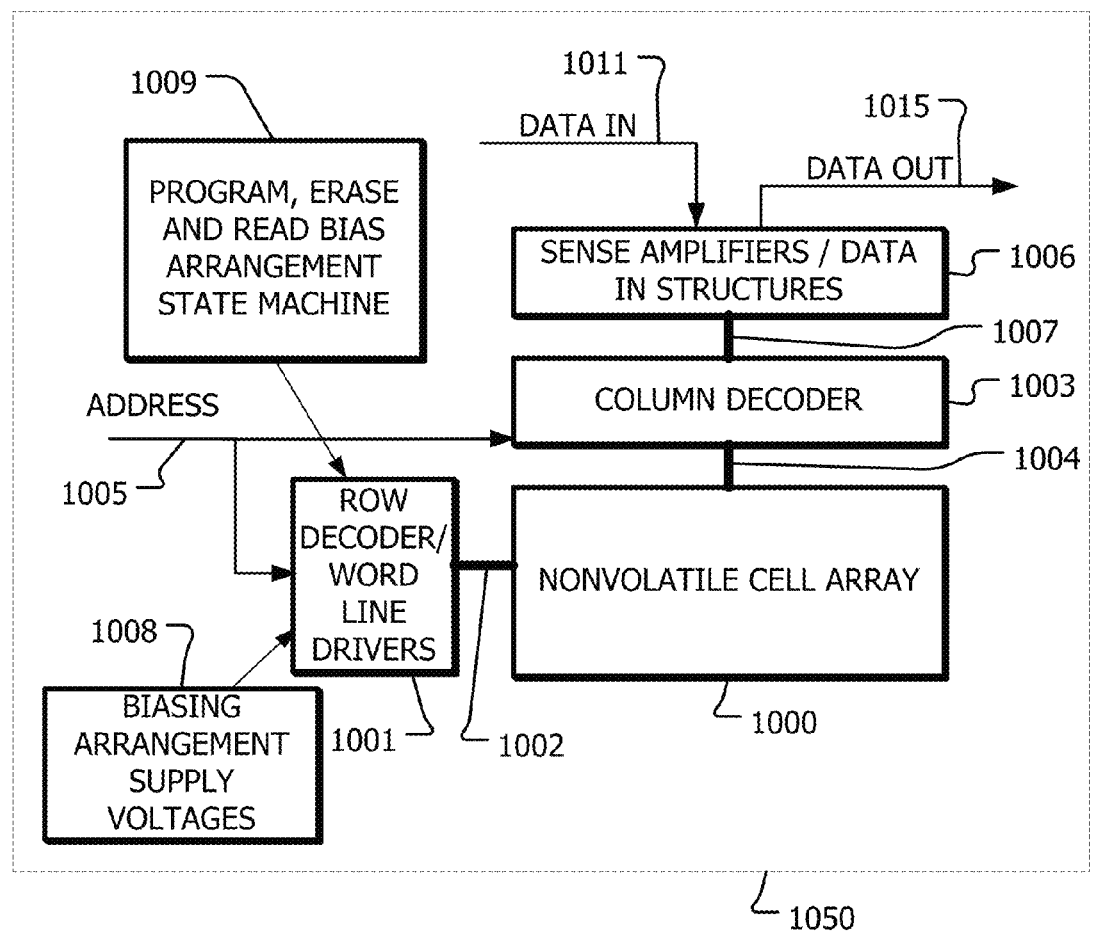
FIG. 23 is a simplified block diagram of an integrated circuit including a memory array implemented using any of the 2T word line driver improvements as described herein.

FIG. 23 is a simplified block diagram of an integrated circuit including a memory array implemented using any of the 2T word line driver improvements as described herein.

FIG. 23 is a simplified block diagram of an integrated circuit 1050 including a memory array 1000. A word line (or row) and block select decoder 1001 is coupled to, and in electrical communication with, a plurality 1002 of word lines and string select lines, and arranged along rows in the memory array 1000. A bit line (column) decoder and drivers 1003 are coupled to and in electrical communication with a plurality of bit lines 1004 arranged along columns in the memory array 1000 for reading data from, and writing data to, the memory cells in the memory array 1000. Addresses are supplied on bus 1005 to the word line decoder and drivers 1001 and to the bit line decoder 1003. Sense amplifiers and data-in structures in block 1006, including current sources for the read, program and erase modes, are coupled to the bit line decoder 1003 via the bus 1007. Data is supplied via the data-in line 1011 from input/output ports on the integrated circuit 1050, to the data-in structures in block 1006. Data is supplied via the data-out line 1015 from the sense amplifiers in block 1006 to input/output ports on the integrated circuit 1050, or to other data destinations internal or external to the integrated circuit 1050. State machine and improved clock circuitry are in circuitry 1009, controlling biasing arrangement supply voltages 1008.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory circuit, comprising:
a word line driver receiving a first voltage reference signal, a second voltage reference signal, and an input signal, the word line driver having an output coupled to a word line; and
control circuitry configured to deselect the word line by applying the input signal to an input of the word line driver, wherein:
during an operation in which the word line is deselected and another word line is selected, the word line discharges through both of a first p-type transistor and a first n-type transistor of the word line driver;
the word line is selected, responsive to the control circuitry applying the input signal having a select value, the select value less than a first reference value of the first voltage reference signal; and
the select value is greater than a third reference value of the second voltage reference signal.

2. The memory circuit of claim 1, wherein, during a program operation in which the word line is deselected and another word line is selected, the control circuitry prevents discharge of the word line via only a p-type transistor of the word line driver.

3. The memory circuit of claim 1, wherein the input signal has one of at least the select value and a deselect value, and the select value and the deselect value have a same voltage polarity during an operation.

4. The memory circuit of claim 1, wherein the first voltage reference signal is received from a global word line, the global word line selecting or deselecting a plurality of word lines positioned in mutual proximity.

5. The memory circuit of claim 1, wherein the word line is deselected, responsive to the control circuitry applying the first voltage reference signal to a first current carrying terminal of the first p-type transistor of the word line driver.

6. The memory circuit of claim 1, wherein the word line is selected, responsive to the control circuitry applying the input signal having the select value turning on the first p-type transistor of the word line driver and the first n-type transistor of the word line driver.

7. The memory circuit of claim 1, wherein the word line is coupled to nonvolatile memory cells.

8. The memory circuit of claim 1, wherein
the word line is selected to have a program voltage less than the first reference value of the first voltage reference signal and greater than the third reference value of the second voltage reference signal.

9. The memory circuit of claim 1, wherein the word line is charged to a program voltage, responsive to the word line driver receiving a first select value in a first select signal and a second select value in a second select signal.

10. The memory circuit of claim 1, wherein consecutive operations changing a word line voltage of the word line are separated by sufficient time to discharge the word line.

11. A method of operating memory, comprising:
receiving, with a word line driver, a first voltage reference signal, a second voltage reference signal, and an input signal, wherein the word line driver has an output coupled to a word line; and
deselecting the word line by applying the input signal to an input of the word line driver, wherein:
during an operation in which the word line is deselected and another word line is selected, the word line discharges through both of a first p-type transistor of the word line driver and a first n-type transistor of the word line driver;
the word line is selected, responsive to control circuitry applying the input signal having a select value, the select value less than a first reference value of the first voltage reference signal; and
the select value is greater than a third reference value of the second voltage reference signal.

12. The method of claim 11, wherein, during program operation in which the word line is deselected and another word line is selected, the control circuitry prevents discharge of the word line via only a p-type transistor of the word line driver.

13. The method of claim 11, wherein the input signal has one of at least the select value and a deselect value, and the select value and the deselect value have a same voltage polarity during a program operation.

14. The method of claim 11, wherein the first voltage reference signal is received from a global word line, the global word line selecting or deselecting a plurality of word lines positioned in mutual proximity.

15. The method of claim 11, wherein the word line is deselected, responsive to the control circuitry applying the first voltage reference signal to a first current carrying terminal of the first p-type transistor of the word line driver.

16. The method of claim 11, wherein the word line is selected, responsive to the control circuitry applying the input signal having the select value turning on the first p-type transistor of the word line driver and the first n-type transistor of the word line driver.

17. The method of claim 11, wherein
the word line is selected to have a program voltage less than the first reference value of the first voltage reference signal and greater than the third reference value of the second voltage reference signal.

18. The method of claim 11, wherein the word line is charged to a program voltage, responsive to the word line driver receiving a first select value in a first select signal and a second select value in a second select signal.

19. The method of claim 11, wherein consecutive operations changing a word line voltage of the word line are separated by sufficient time to discharge the word line.

20. The memory circuit of claim 1, wherein during an operation in which the word line is deselected the control circuitry applies the input signal having a deselect value to the input of the word line driver, the deselect value being a negative voltage.

21. The memory of claim 11, wherein during an operation in which the word line is deselected the control circuitry applies the input signal having a deselect value to the input of the word line driver, the deselect value being a negative voltage.

* * * * *